(12) United States Patent
Hsieh

(10) Patent No.: US 8,207,802 B2
(45) Date of Patent: Jun. 26, 2012

(54) MEMORY CELL BASED ARRAY OF TUNING CIRCUIT

(75) Inventor: Hong-Yean Hsieh, Santa Clara, CA (US)

(73) Assignee: Realtek Semiconductor Corp., Science Park, Hsinchu (TW)

( * ) Notice: Subject to any disclaimer, the term of this patent is extended or adjusted under 35 U.S.C. 154(b) by 622 days.

(21) Appl. No.: 12/493,239

(22) Filed: Jun. 28, 2009

(65) Prior Publication Data

US 2010/0001818 A1    Jan. 7, 2010

Related U.S. Application Data

(60) Provisional application No. 61/077,163, filed on Jul. 1, 2008.

(51) Int. Cl.
*H03J 3/20* (2006.01)
(52) U.S. Cl. ......................................................... 334/78
(58) Field of Classification Search .................... 334/65, 334/66, 69, 78; 333/32, 17.3
See application file for complete search history.

(56) References Cited

U.S. PATENT DOCUMENTS

2010/0156575 A1*   6/2010   Shah et al. ...................... 334/78
* cited by examiner

*Primary Examiner* — Stephen Jones
(74) *Attorney, Agent, or Firm* — IPR Works, LLC

(57) ABSTRACT

A method applied in a tuning circuit comprising a plurality of turning cells is disclosed. the method comprises: laying out an array of tuning cells in a matrix configuration, the matrix comprising a first dimension and a second dimension; assigning a first index associated with the first dimension and a second index associated with the second dimension to each tuning cell; controlling each tuning cell using a word line and a bit line; and summing up outputs from all tuning cells to form a combined output. The tuning cell provides a first circuit value or a second circuit value according to the logical value of the bit line, and the difference between the first circuit value and the second circuit value is determined such that a turning resolution of the tuning circuit is determined.

22 Claims, 8 Drawing Sheets

MEMORY CELL BASED ARRAY OF TUNING CIRCUIT

CROSS REFERENCE TO RELATED APPLICATIONS

The present application claims priority benefits under 35 U.S.C. §119(e) from U.S. Provisional Application No. 61/077,163, filed on Jul. 1, 2008, entitled "MEMORY CELL BASED ARRAY OF TUNING ELEMENTS" which is hereby incorporated herein in its entirety by reference.

BACKGROUND OF THE INVENTION

1. Field of the Invention

The present invention relates generally to electrical circuits, and more particularly but not exclusively to circuit elements for digitally tuned circuits fabricated as part of monolithic integrated circuits.

2. Description of the Background Art

Digitally tuned circuits are employed in a wide variety of applications involving data and voice communications. For portability, reliability, cost and other reasons, digitally tuned circuits are preferably fabricated as part of a monolithic integrated circuit (IC). In order to provide finer tuning resolutions and wider tuning ranges, a large number of tuning circuit elements comprising capacitors, inductors, and the like are needed for adjusting frequencies.

The finer the resolution of the tuning circuit element is, the more the tuning circuit elements are needed in order to cover the same tuning ranges under voltage and temperature variations. To reduce area cost, an efficient scheme based on an array of memory cells are proposed in this invention.

SUMMARY

In various embodiments, a tuning circuit is disclosed, the tuning circuit including a plurality of tuning cells, each of said tuning cells including a tuning element and a memory cell, the tuning element configured to be controlled by a logical control signal from the memory cell.

In one embodiment, the tuning element (of each of said plurality of tuning circuit cells) includes a first sub-element and a second sub-element. The first sub-element is configured to receive the logical control signal, while the second sub-element is configured to receive a logical inversion of the logical control signal. The first sub-element is configured to generate a first circuit value when the logical control signal is of a first logical value (e.g., logical 1) and a second circuit value when the logical signal is of a second logical value (e.g., logical 0), the first and second logical values being binary and complementary with each other. The second sub-element is configured to generate a third circuit value when the logical control signal is of the second logical value and a fourth circuit value when the logical control signal is of the first logical value. A sum of the first and fourth circuit values is provided as a first output value at an output node of the tuning element. A sum of the second and third circuit values is provided as a second output value at the output node of the tuning element. The sum of the first and fourth circuit values is different from the sum of the second and third circuit values.

In another embodiment, each tuning element (of each of said plurality of tuning circuit cells) includes only a single sub-element. The sub-element is configured to receive the logical control signal and to generate a first circuit value when the logical control signal is of a first logical value (e.g., 1) and a second circuit value when the logical control signal is of a second logical value (e.g., 0), the first and second logical values being binary and complementary with each other.

The logical control signal for the tuning element (in various embodiments) is generated from the memory cell. In one embodiment, the memory cell is configured to be controlled by a word line and a bit line, and to store a value of the logical control signal. A logical value of the bit line is written into the memory cell when the word line is asserted. The value of the logical control signal is held when the word line is not asserted.

In various embodiments, a tuning circuit is disclosed, the tuning circuit comprising a two-dimensional array of tuning cells laid out in a matrix configuration. The matrix comprises a first dimension (e.g. row) of size M and a second dimension (e.g. column) of size N. The first dimension is controlled by M word lines, and the second dimension is controlled by N bit lines. Depending on its index within the matrix, each tuning cell is controlled by a respective word line and a respective bit line. A logical value of the respective bit line is written into the tuning cell when the respective word line is asserted. An output of the tuning cell is controlled by the logical value written to the tuning cell. Outputs from all tuning cells are summed up to form an output of the tuning circuit.

In various embodiments, a tuning circuit is disclosed, the tuning circuit comprising a two-dimensional array of tuning cells laid out in a matrix configuration. The matrix comprises a first dimension (e.g. row) of size M and a second dimension (e.g. column) of size N. The first dimension is controlled by M word lines of a first group and M word lines of a second group, and the second dimension is controlled by N bit lines of a third group and N bit line of a fourth group. Depending on its index within the matrix, each tuning cell is controlled by a respective word line from the first group, a respective word line from the second group, a respective bit line from the third group, and a respective bit line from the fourth group. A logical value of the respective bit line of the third group is written into the tuning cell when the respective word line of the first group is asserted. A logical value of the respective bit line of the fourth group is written into the tuning cell when the respective word line of the second group is asserted. To prevent logical contention, the respective word line of the first group and the respective word line of the second group should not be asserted at the same time. An output of the tuning cell is controlled by the logical value written to the tuning cell. Outputs from all tuning cells are summed up to form an output of the tuning circuit.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of electrical circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
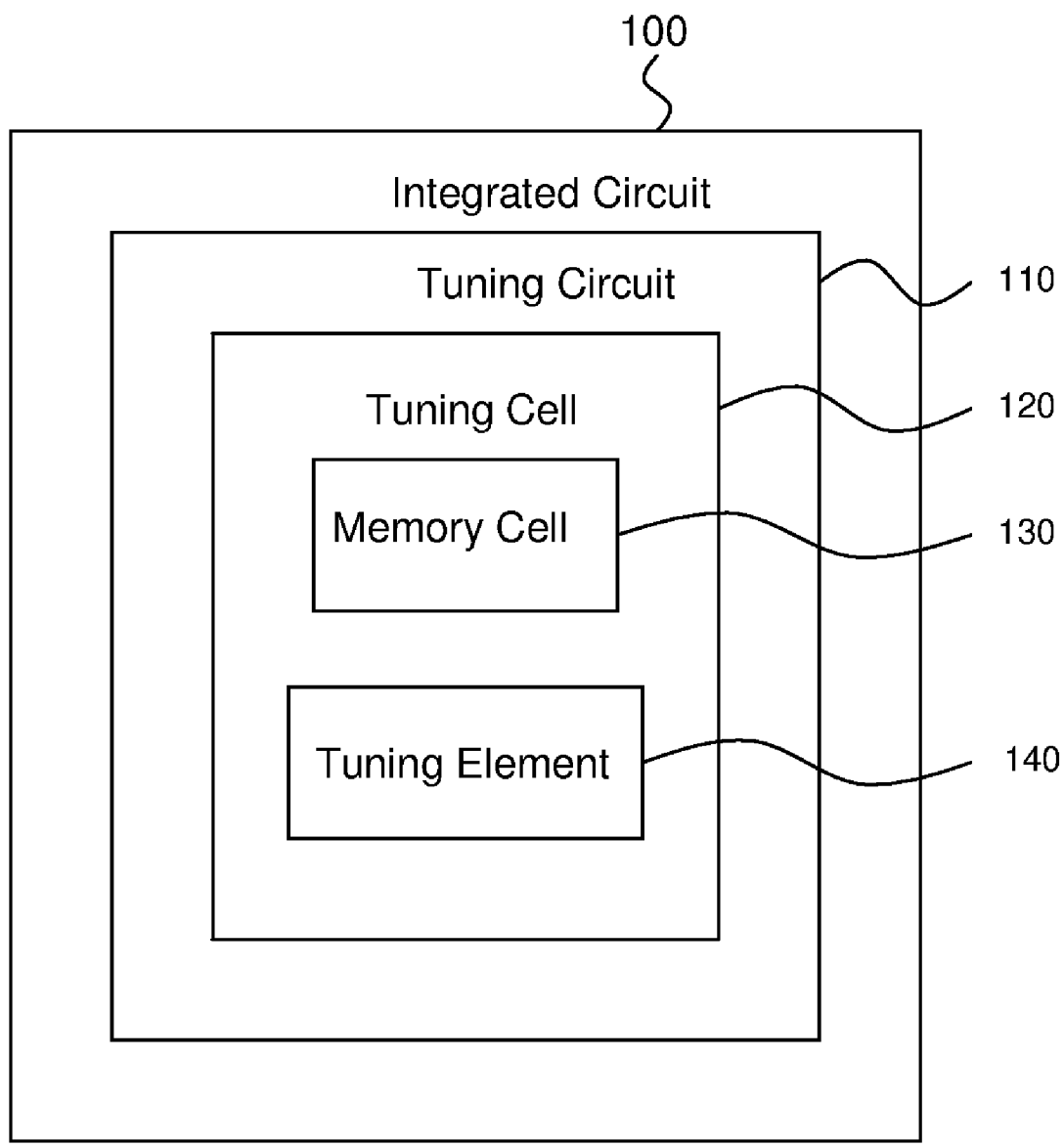
FIG. 1 shows a monolithic integrated circuit in accordance with an embodiment of the present invention.

Embodiments of the present invention advantageously allow for fabrication of tuning circuits in a monolithic IC. Such a monolithic IC is shown in FIG. 1, where a tuning circuit 110 is fabricated with one or more tuning cells 120 in a monolithic IC 100. The tuning circuit 110 is a memory cell based array of tuning elements used for frequency tuning, such as a digitally controlled oscillator, for example. The memory cell based array of tuning elements 110 includes a plurality of tuning cells 120, each of said tuning cells including a memory cell 130 and a tuning element 140, the tuning element configured to be controlled by a logical control signal from the memory cell. The memory cell 130 can be any storage device with compact layout. The tuning element 140 can be any components and circuits, such as transistors or varactors.

Figure 2:
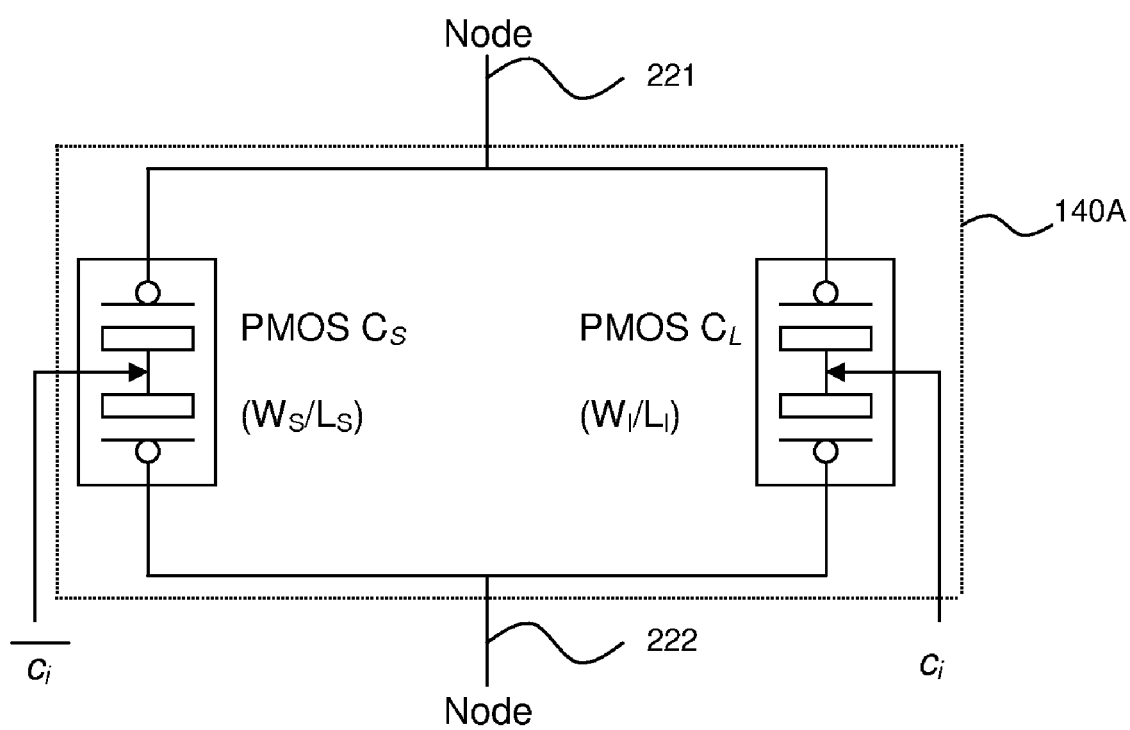
FIG. 2(a) schematically shows a tuning element in accordance with an embodiment of the present invention.
FIG. 2(b) schematically shows another tuning element in accordance with an embodiment of the present invention.
Figure 2:
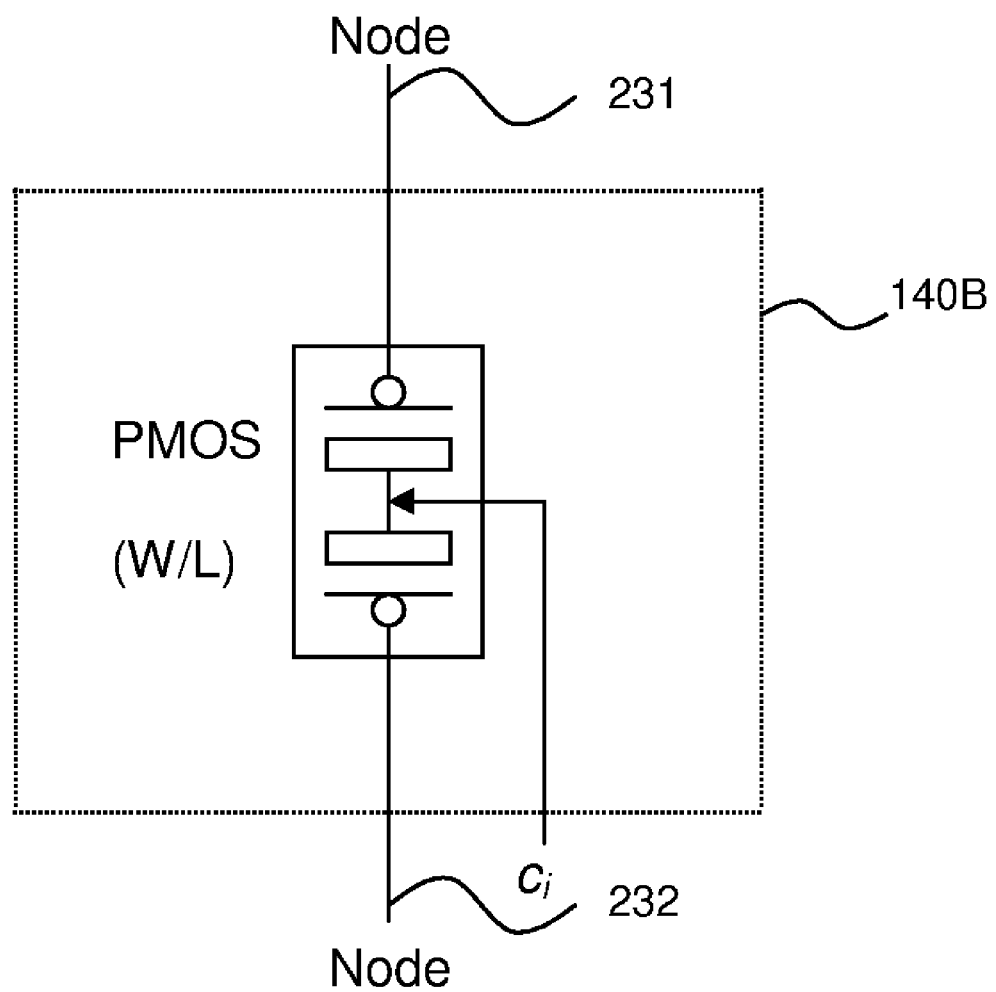

FIG. 2(a) schematically shows a tuning circuit element 140A in accordance with an embodiment of the present invention. The tuning element 140A is configured to receive a first digital control input signal $c_i$ and a second digital control input signal $\overline{c_i}$. In the example of FIG. 2(a), the tuning circuit element 140A includes two sub-element circuits namely, a larger sub-element (labeled as "$C_L$") and a smaller sub-element (labeled as "$C_S$"). Each sub-element includes a pair of PMOS (p-type metal-oxide-semiconductor) transistors. The smaller sub-element $C_S$ has smaller transistor sizes than the larger sub-element $C_L$. The larger sub-element accepts a digital control signal input $c_i$ and the smaller sub-element accepts a digital control signal input $\overline{c_i}$. The control input signals $c_i$ and $\overline{c_i}$ are binary and complementary with each other. In other words, $c_i$ is a binary one when $\overline{c_i}$ is a binary zero, and vice versa.

In one embodiment, the larger sub-element has a capacitance value of $C_{L\_on}$ when its associated control input signal $c_i$ is a binary one and a capacitance value of $C_{L\_off}$ when its associated control input signal $c_i$ is a binary zero. The smaller sub-element has a capacitance value of $C_{s\_on}$ when its associated control input signal $\overline{c_i}$ is a binary one, and a capacitance value of $C_{s\_off}$ when its associated control input signal $\overline{c_i}$ is a binary zero. In the example of FIG. 2(a), the capacitance value of the tuning element 140A is the sum of the capacitance values of the larger and smaller sub-elements.

Given that the control input signals $c_i$ and $\overline{c_i}$ are binary and complementary, the tuning element 140A of FIG. 2(a) has two possible capacitance values across the output nodes 221 and 222: a first capacitance value of a sum of $C_{L\_on}$ and $C_{s\_off}$ when the control input signal $c_i$ is at a first logical value (binary one in this example) and a second capacitance value of a sum of $C_{L\_off}$ and $C_{s\_on}$ when the control input signal $c_i$ is at a second logical value (binary zero in this example), the first and second logical values being binary and complementary with each other.

In one embodiment, the capacitance values $C_{L\_on}$ and $C_{s\_on}$ are substantially the same, with $C_{L\_on}$ being slightly larger than $C_{s\_on}$. For example, $C_{L\_on}$ may be at most 20% larger than $C_{s\_on}$. Similarly, the capacitance values $C_{L\_off}$ and $C_{s\_off}$ are substantially the same, with $C_{L\_off}$ being slightly larger than $C_{s\_off}$, e.g., $C_{L\_off}$ being larger than $C_{s\_off}$ by at most 20%. The smaller the difference between $C_{L\_on}$ and $C_{s\_on}$ and between $C_{L\_off}$ and $C_{s\_off}$ is, the finer the resulting tuning resolution is. The capacitance ($C_{L\_on}+C_{s\_off}$) is greater than the capacitance ($C_{s\_on}+C_{L\_off}$). That is, the difference between $C_{L\_on}$ and between $C_{L\_off}$ and $C_{s\_off}$ are determined such that the resulting tuning resolution of the tuning circuit can be changed or determined.

FIG. 2(b) schematically shows another tuning circuit element 140B in accordance with an embodiment of the present invention. The tuning element 140B is configured to receive a digital control input signal $c_i$. In the example of FIG. 2(b), the tuning circuit element includes only a single sub-element. The sub-element is configured to receive the digital control input signal $c_i$ and to generate a first circuit value when the digital control input signal is at a first logical value (e.g., binary one) and a second circuit value when the digital control signal is at a second logical value (e.g., binary zero), the first and second logical values being binary and complementary with each other. In this embodiment, the sub-element has a first capacitance value of $C_{on}$ when its associated control input signal is at the first logic value (a binary one), and a second capacitance value of $C_{off}$ when its associated control input signal is at the second logic value (a binary zero). The tuning element has two possible capacitance values across its output nodes 231 and 232: the first capacitance value of $C_{on}$ when the control input signal $c_i$ is at the first logical value (binary one in this example), and the second capacitance value of $C_{off}$ when the control input signal $c_i$ is at the second logical value (binary zero in this example). In one embodiment, the capacitance values $C_{on}$ and $C_{off}$ are substantially the same, with $C_{on}$ being slightly larger than $C_{off}$. For example, $C_{on}$ may be at most 20% larger than $C_{off}$. The smaller the difference between $C_{on}$ and $C_{off}$ is, the finer the resulting tuning resolution is. That is, the difference between $C_{on}$ and $C_{off}$ is controlled such that the resulting tuning resolution of the digital tuning circuit can be adjusted. That is, the designer designs the difference between the first capacitance value and the second capacitance value according to the resulting tuning resolution of the digital tuning circuit. In an embodiment, the first capacitance value and the second capacitance value are replaced by the first inductance value and the second inductance value.

Figure 3A:
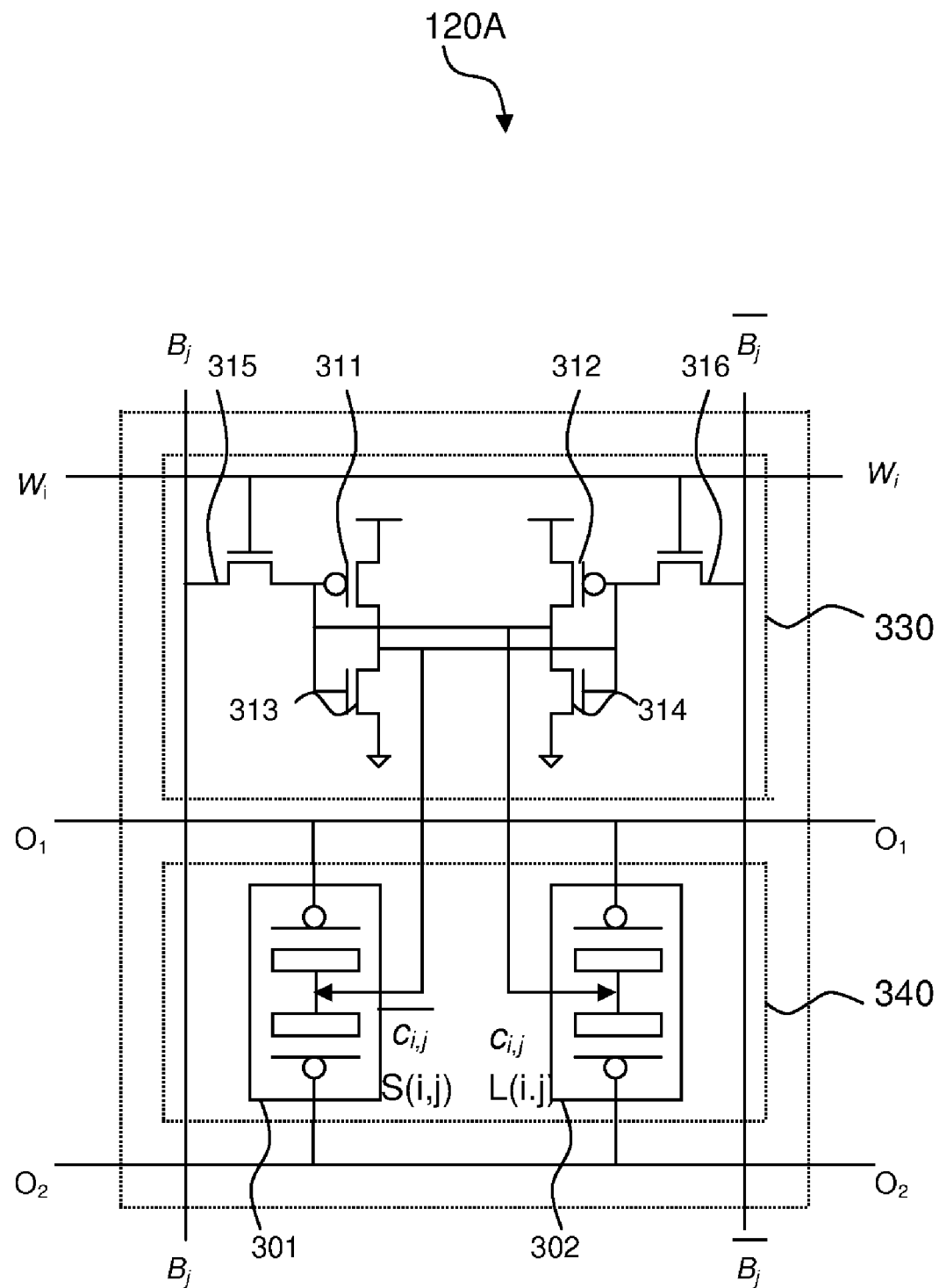
FIG. 3(a) schematically shows a tuning cell that includes a one-port memory cell and a tuning element in accordance with an embodiment of the present invention.

The digital control input signal for the tuning element (in various embodiments) is generated from a memory cell. In one embodiment, FIG. 3(a) schematically shows a tuning cell 120A in accordance with an embodiment of the present invention. The tuning cell 120A comprises a memory cell 330 and a tuning element 340. The tuning cell 120A is configured to receive a word line $W_i$, a first bit line $B_j$, and a second bit line $\overline{B_j}$ and to generate a capacitance value across its output nodes $O_1$ and $O_2$. Two control signals out of the memory cell 330 are connected to the control lines $c_{i,j}$ and $\overline{c_{i,j}}$ of the tuning element 340. In one embodiment, the memory cell 330 is a static random access memory with one read/write port. The two cross-connected inverters 311, 312, 313, and 314 in the memory cell 330 store the data. The stored logic value in the memory cell 330 determines the capacitance value across the output nodes $O_1$ and $O_2$ of the tuning element 340. If the stored logic value is a binary one, the first capacitance value of a sum of $C_{L\_on}$ and $C_{s\_off}$ across the two output nodes $O_1$ and $O_2$ is generated. If the stored logic value is a binary zero, the second capacitance value of a sum of $C_{L\_off}$ and $C_{s\_on}$ across the output nodes $O_1$ and $O_2$ is generated.

A logic value at the bit line $B_j$ can be written into the memory cell 330 through transistors 315 and 316. The transistors 315 and 316 are two NMOS (n-type metal-oxide-semiconductor) transistors. If the word line $W_i$ is asserted (e.g. binary one), the complementary data values in the first and second bit lines $B_j$ and $\overline{B_j}$ are written into the memory cell to replace its original stored data. If the word line is not asserted (e.g. binary zero), the data in the memory cell will be held. For example, if a binary one is written into the memory cell 330, the first and second bit lines are set to a binary one and a binary zero, respectively, with the word line asserted, (e.g., binary one). If a binary zero is written into the memory cell 330, the first and second bit lines are set to a binary zero and a binary one, respectively, with the word line asserted, (e.g., binary one).

Figure 3B:
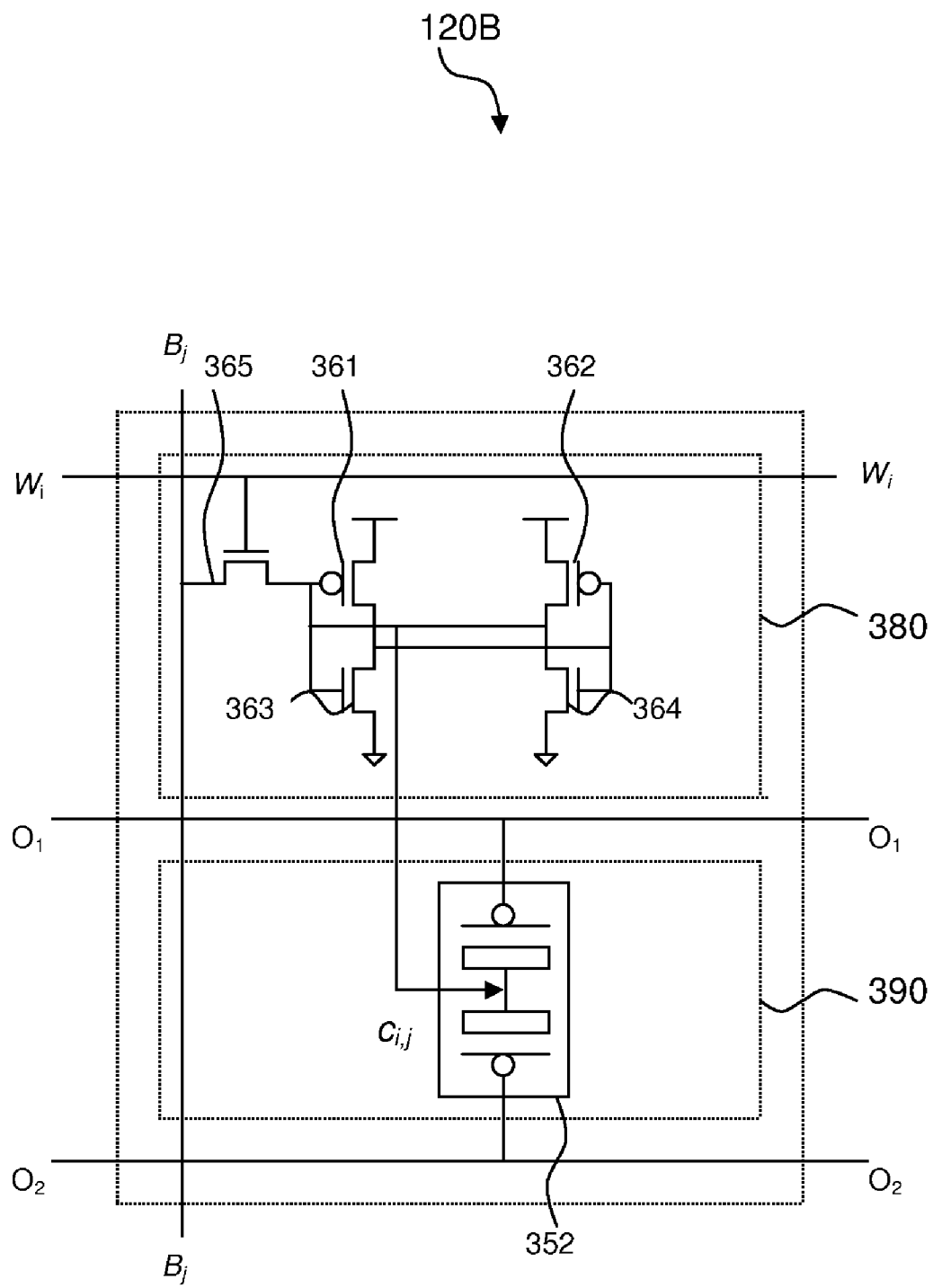
FIG. 3(b) schematically shows another tuning cell that includes a memory cell and a tuning element in accordance with an embodiment of the present invention.

In another embodiment, FIG. 3(b) schematically shows a tuning cell 120B in accordance with an embodiment of the present invention. The tuning cell 120B comprises a memory cell 380 and a tuning element 390. The tuning cell 120B is configured to receive a word line $W_i$ and a bit line $B_j$ and to generate a capacitance value across its output nodes $O_1$ and $O_2$. A control signal out of the memory cell 380 is connected to the control lines $c_{i,j}$ of the tuning element 390. A logic value in the bit line $B_j$ is written into the memory cell when the word line $W_i$ is asserted. The two cross-connected inverters 361, 362, 363, and 364 in the memory cell 380 store the data. The stored logic value in the memory cell 380 determines the capacitance value across the output nodes $O_1$ and $O_2$ of the tuning element 390. If the stored logic value is a binary one, a first capacitance value of $C_{on}$ across the two output nodes $O_1$ and $O_2$ is generated. If the stored logic value is a binary zero, a second capacitance value of $C_{off}$ across the output nodes $O_1$ and $O_2$ is generated.

A logic value at the bit line $B_j$ can be written into the memory cell 380 through transistors 365. The transistor 365 is a NMOS (n-type metal-oxide-semiconductor) transistor. If the word line $W_i$ is asserted (e.g. binary one), the data value in the bit line $B_j$ is written into the memory cell to replace its original stored data. If the word line is not asserted (e.g. binary zero), the data in the memory cell will be held. To successfully write a new data into the memory cell 380, the driving capability of the inverter comprising transistors 361 and 363 is stronger than the inverter comprising transistors 362 and 364. In other words, the widths of transistors 361 and 363 are made larger than the widths of transistors 362 and 364. For example, if a binary one is written into the memory cell 380, the bit line is set to a binary one with the word line asserted, (e.g., binary one). If a binary zero is written into the memory cell 380, the bit line is set to a binary zero with the word line asserted, (e.g., binary one).

Figure 4:
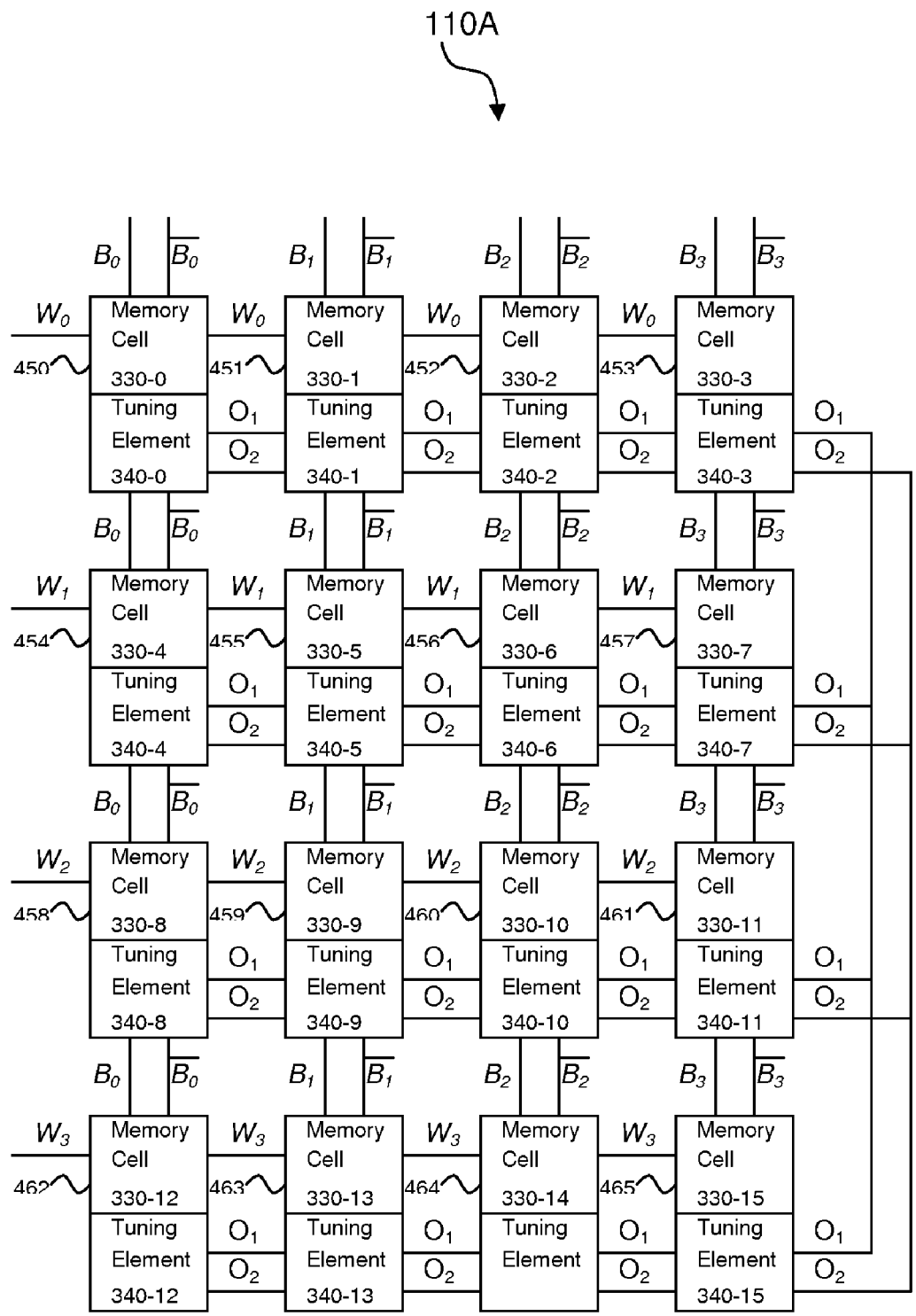
FIG. 4 schematically shows an array of tuning cells in accordance with an embodiment of the present invention.

A memory cell based array of tuning elements comprises a two-dimensional array of tuning cells laid out in a matrix configuration, where M×N tuning cells are arranged in M rows and N columns. In one embodiment, FIG. 4 schematically shows a memory cell based array of tuning elements 110A in accordance with an embodiment of the present invention where M=4 and N=4. The memory cell based array of tuning elements 110A is configured to receive 4 word lines ($W_0$, $W_1$, $W_2$, and $W_3$), 4 first bit lines ($B_0$, $B_1$, $B_2$, and $B_3$), and 4 second bit lines ($\overline{B_0}$, $\overline{B_1}$, $\overline{B_2}$, and $\overline{B_3}$) and to generate a capacitance value across its two output nodes $O_1$ and $O_2$. The memory cell based array of tuning elements 110A comprises a total of 16 tuning cells 120A. There are a total of four rows and four tuning cells are arranged in each row. Depending on its index within the matrix, each tuning cell is controlled by the respective word line and respective bit lines.

The outputs nodes $O_1$ of all the tuning cells are connected together and so are the output nodes $O_2$. Therefore, the capacitance value across the output nodes $O_1$ and $O_2$ of the array of the tuning cells 110A is the sum of the capacitance values of all the tuning cells, which depends on logic value stored in the memory cell and the first and second capacitance values of each tuning element. Each tuning cell generates a capacitance value dependent on the logic value stored in its associated memory cell. For example, when the logic value stored in the memory cell is a binary one, the capacitance value of the tuning cell is ($C_{l\_on}+C_{s\_off}$). When the logic value stored in the memory cell is a binary zero, the capacitance value of the tuning cell is ($C_{s\_on}+C_{l\_off}$).

In one embodiment, only one word line out of the plurality of the word lines can asserted at one time. When the word line $W_i$ is asserted, a row of tuning cells is selected and the complementary data values at the first and second bit lines ($B_j$ and $\overline{B_j}$) are written into the memory cells connected to the word line $W_i$. When the word line $W_i$ is asserted, the logic values in the first bit line $B_j$ and its corresponding second bit line $\overline{B_j}$ are complementary with each other.

Figure 5:
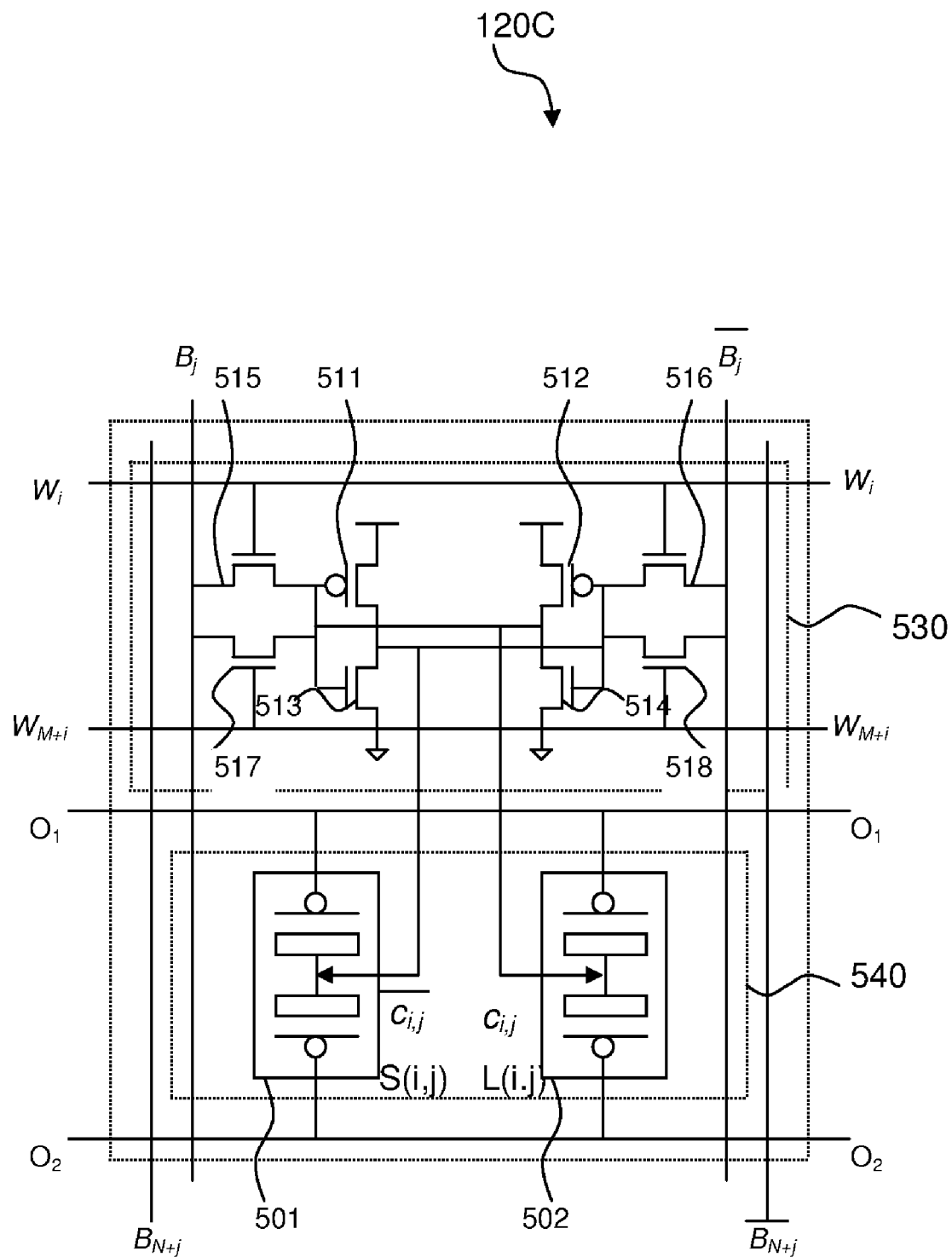
FIG. 5 schematically shows a tuning cell that includes a two-port memory cell and a tuning element in accordance with another embodiment of the present invention.

In one embodiment, FIG. 5 schematically shows a tuning cell 120C in accordance with an embodiment of the present invention. The tuning cell 120C is configured to receive a first word line $W_i$, a second word line $W_{M+i}$, a first bit line $B_j$, a second bit line $\overline{B_j}$, a third bit line $B_{N+j}$, and a fourth bit line $\overline{B_{N+j}}$ and to generate a capacitance value across its two output nodes $O_1$ and $O_2$. The tuning cell 120C comprises a memory cell 530 and a tuning element 540. Two control signals out of the memory cell 530 are connected to the control lines $c_{i,j}$ and $\overline{c_{i,j}}$ of the tuning element 540. In one embodiment, the memory cell 530 is a static random access memory with two read/write ports. The two cross-connected inverters 511, 512, 513, and 514 in the memory cell 530 store the data. The stored logic value in the memory cell 530 determines the capacitance value across the output nodes $O_1$ and $O_2$ of the tuning element 540. If the stored logic value is a binary one, the first capacitance value of a sum of $C_{L\_on}$ and $C_{s\_off}$ across the output nodes $O_1$ and $O_2$ is generated. If the stored logic value is a binary zero, the second capacitance value of a sum of $C_{L\_off}$ and $C_{s\_on}$ across the output nodes $O_1$ and $O_2$ is generated.

A logic value at the bit line $B_j$ can be written into the memory cell 530 through transistors 515 and 516 or through transistors 517 and 518. If the first word line $W_i$ is asserted (e.g. a binary one), the complementary data values in the first and second bit lines $B_j$ and $\overline{B_j}$ are written through transistors 515 and 516 into the memory cell to replace its original stored values. If the second word line $W_{M+i}$ is asserted (e.g. a binary one), the complementary data values in the third and fourth bit lines $B_{N+j}$ and $\overline{B_{N+j}}$ are written through transistors 517 and 518 into the memory cell to replace its original stored values. Note that the first and second word lines will not be asserted at the same time. If both word lines are not asserted (e.g. binary zero), the data in the memory cell will be held.

Figure 6:
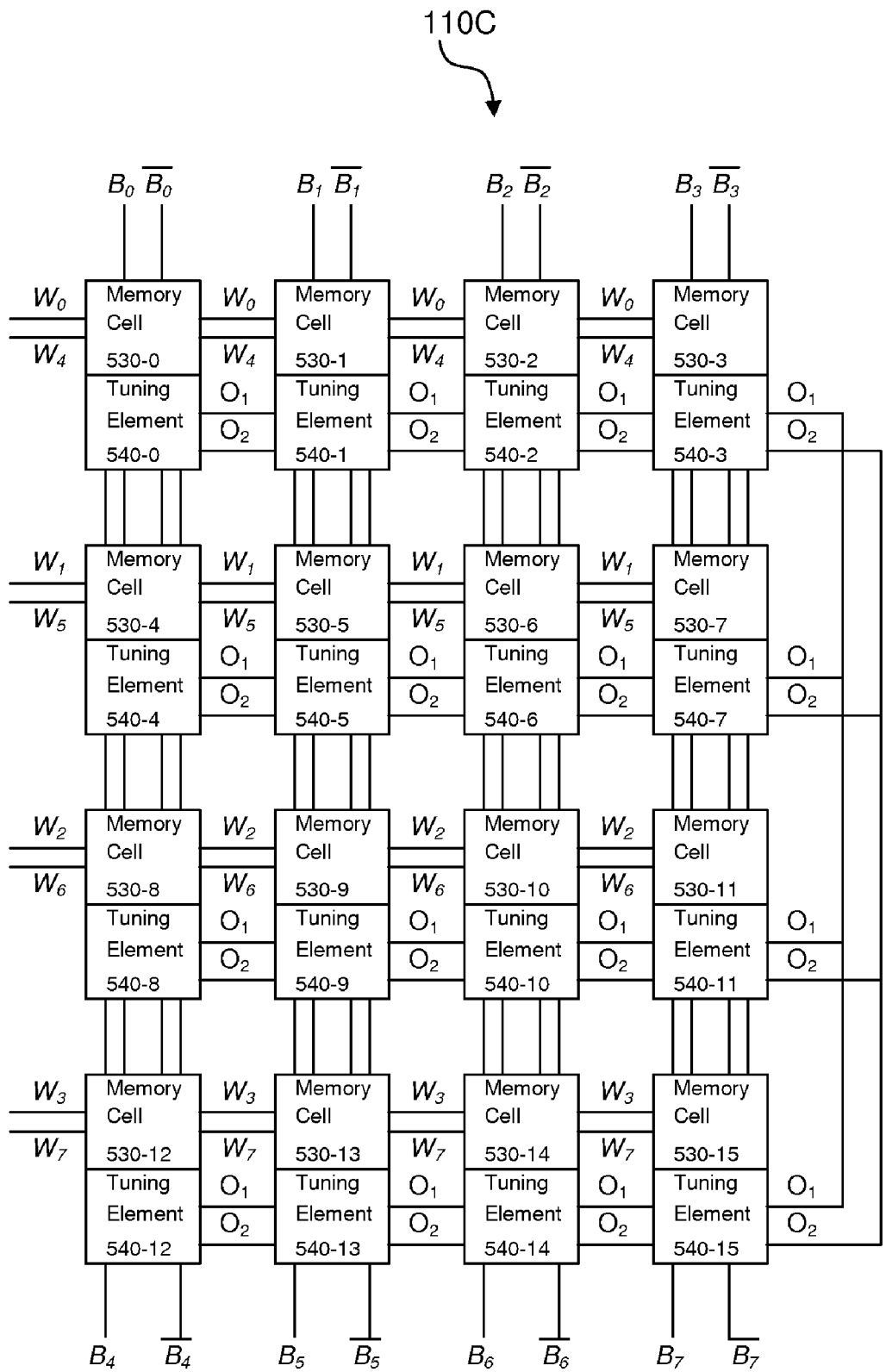
FIG. 6 schematically shows an array of tuning cells in accordance with an embodiment of the present invention.

A memory cell based array of tuning elements comprises a two-dimensional array of tuning cells laid out in a matrix configuration, where M×N tuning cells are arranged in M rows and N columns. In one embodiment, FIG. 6 schematically shows a memory cell based array of tuning elements 110C in accordance with an embodiment of the present invention where M=4 and N=4. The memory cell based array of tuning elements 110C is configured to receive 4 first word lines ($W_0$, $W_1$, $W_2$, and $W_3$), 4 second word lines ($W_4$, $W_5$, $W_6$, and $W_7$), 4 first bit lines ($B_0$, $B_1$, $B_2$, and $B_3$), 4 second bit lines ($\overline{B_0}$, $\overline{B_1}$, $\overline{B_2}$, and $\overline{B_3}$), 4 third bit lines ($B_4$, $B_5$, $B_6$, and $B_7$), and 4 fourth bit lines ($\overline{B_4}$, $\overline{B_5}$, $\overline{B_6}$, and $\overline{B_7}$) and to generate a capacitance value across its two output nodes $O_1$ and $O_2$. The memory cell based array of tuning elements 110C comprises a total of 16 tuning cells 120C. There are a total of four rows and four tuning cells are arranged in each row.

The outputs nodes $O_1$ of all the tuning cells are connected together and so are the output nodes $O_2$. Therefore, the capacitance value across the output nodes $O_1$ and $O_2$ is the sum of the capacitance values of all the tuning cells, which depends on logic value stored in the memory cell and the first and second capacitance values of each tuning element. Each tuning cell generates a capacitance value dependent on the logic value in its associated memory cell. For example, when the logic value stored in the memory cell is a binary one, the capacitance value of the tuning cell is ($C_{l\_on}+C_{s\_off}$). When the logic value stored in the memory cell is a binary zero, the capacitance value of the tuning cell is ($C_{s\_on}+C_{l\_off}$).

In one embodiment, only one word line out of the first word lines can be asserted at one time. When the word line $W_i$ is enabled, a row of tuning cells is selected and the complementary data values at the first and second bit lines ($B_j$ and $\overline{B_j}$) are written into the memory cells connected to the word line $W_i$. When the word line $W_i$ is asserted, the logic values in the first bit line $B_j$ and its corresponding second bit line $\overline{B_j}$ are complementary with each other.

In one embodiment, only one word line out of the second word lines can be asserted at one time. When the second word line $W_{M+i}$ is asserted, a row of tuning cells is selected and the complementary data values at the third and fourth bit lines ($B_{N+j}$ and $\overline{B_{N+j}}$) are written into the memory cells connected to the word line $W_{M+i}$. When the word line $W_{M+i}$ is asserted, the data values in the third bit line $B_{N+j}$ and its corresponding fourth bit line $\overline{B_{N+j}}$ are complementary with each other.

In one embodiment, no two word lines ($W_i$ and $W_{M+i}$) connected to a memory cell will be asserted at the same time. Note that the tuning cells in two different rows can be accessed at the same time by asserting one word line out of the first word lines and another word line out of the second word lines.

A memory cell based array of tuning elements has been disclosed. While specific embodiments of the present invention have been provided, it is to be understood that these embodiments are for illustration purposes and not limiting. Many additional embodiments will be apparent to persons of ordinary skill in the art reading this disclosure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A tuning circuit comprising a array of tuning cells laid out in a matrix configuration, wherein:
   the matrix comprises a first dimension and a second dimension;
   each said tuning cell has a first index associated with the first dimension and a second index associated with the second dimension;
   each said tuning cell is configured to receive a word line and a bit line, wherein a circuit value of said tuning cell is set by a logical value of the bit line when the word line is asserted; and
   said circuit values of all said tuning cells are summed to form an output of the tuning circuit.

2. The tuning circuit of claim 1, wherein the tuning cell provides a first circuit value or a second circuit value according to the logical value of the bit line, wherein the difference between the first circuit value and the second circuit value is determined such that a turning resolution of the tuning circuit is determined.

3. The tuning circuit of claim 1, wherein all tuning cells of the same first index share a common word line; wherein all tuning cells of the same second index share a common bit line.

4. The tuning circuit of claim 3, wherein: each tuning cell is further configured to receive a complementary bit line and all tuning cells of the same second index share a common complementary bit line.

5. The tuning circuit of claim 1, wherein each tuning cell comprises a memory cell and a tuning element, the tuning element determines the circuit value of said tuning cell in accordance with a binary data stored in the memory cell.

6. The tuning circuit of claim 5, wherein the binary data of the memory cell is held when the word line is not asserted.

7. The tuning circuit of claim 5, wherein the tuning element is a MOS (metal-oxide semiconductor) device having a capacitance controlled by a bias voltage associated with a value of the binary data stored in the memory cell.

8. The tuning circuit of claim 5, wherein the logical value of the bit line is written into the tuning cell when the word line is asserted.

9. The tuning circuit of claim 8, wherein the memory cell comprises a switch circuit, the switch circuit is closed when the word line is asserted.

10. The tuning circuit of claim 5, wherein the memory cell comprises first and second inverters configured in a cross-coupled topology.

11. The tuning circuit of claim 10, wherein a driving capability of the first inverter is stronger than that of the second inverter.

12. The tuning circuit of claim 10, wherein the first inverter comprises first and second transistors and the second inverter comprises third and four transistors, widths of the first and second transistors are made larger than widths of the third and four transistors.

13. A method applied in a tuning circuit comprising a plurality of turning cells, the method comprising:
   laying out a array of tuning cells in a matrix configuration, the matrix comprising a first dimension and a second dimension;
   assigning a first index associated with the first dimension and a second index associated with the second dimension to each tuning cell;
   controlling each tuning cell using a word line and a bit line, wherein a logical value of the bit line is written into the tuning cell when the word line is asserted; and
   summing up outputs from all tuning cells to form a combined output.

14. The method of claim 13, wherein the logical value of the bit line is written into the tuning cell when the word line is asserted.

15. The method of claim 13, wherein the tuning cell provides a first circuit value or a second circuit value according to the logical value of the bit line, wherein a difference between the first circuit value and the second circuit value is determined such that a turning resolution of the tuning circuit is determined.

16. The method of claim 13, further comprising:
sharing the same word line for all tuning cells of the same first index; and
sharing the same bit line for all tuning cells of the same second index.

17. The method of claim 16, wherein controlling each tuning cell using a word line and a bit line further comprising using a commentary bit line to facilitate writing the logical value of the bit line into the tuning cell when the word line is asserted, and all tuning cells of the same second index share the same complementary bit line.

18. The method of claim 13, wherein each tuning cell comprises a memory cell and a tuning element, the tuning element determining the circuit value of said tuning cell in accordance with a binary data stored in the memory cell.

19. The method of claim 18, wherein the tuning element is a MOS (metal-oxide semiconductor) device having a capacitance controlled by a bias voltage associated with a value of the binary data stored in the memory cell.

20. The method of claim 13, wherein the memory cell comprises a first and second inverters configured in a cross-coupled topology.

21. The method of claim 20, wherein a driving capability of the first inverter is stronger than that of the second inverter.

22. The method of claim 20, wherein the first inverter comprises first and second transistors and the second inverter comprises third and four transistors, widths of the first and second transistors are made larger than widths of the third and four transistors.

* * * * *